United States Patent [19]

Capps, Jr. et al.

[11] Patent Number: 5,764,529

[45] Date of Patent: Jun. 9, 1998

[54] METHOD AND APPARATUS FOR AUTOMATIC FREQUENCY AND VOLTAGE SELECTION FOR MICROPROCESSORS

[75] Inventors: Louis Bennie Capps, Jr., Round Rock; Son Hung Lam; John Blake Pavelka, both of Austin; An Xuan Tra, Round Rock, all of Tex.

[73] Assignee: International Business Machines Corporation, Armonk, N.Y.

[21] Appl. No.: 773,544

[22] Filed: Dec. 23, 1996

[51] Int. Cl.$^6$ ........................................ G06F 1/04
[52] U.S. Cl. ........................................ 364/489; 395/500
[58] Field of Search ........................ 364/483, 489, 364/490; 395/500; 323/241

[56] References Cited

U.S. PATENT DOCUMENTS 5,455,927  10/1995  Huang ........................ 395/500
5,546,563  8/1996  Chuang ........................ 395/500

*Primary Examiner*—Emanuel Todd Voeltz
*Assistant Examiner*—Thomas Peeso
*Attorney, Agent, or Firm*—David A. Mims, Jr.

[57] ABSTRACT

A method and apparatus for providing automatic frequency and voltage selection for microprocessors in a computer system. Microprocessor identification (ID) bits are burned into a microprocessor during manufacture to specify the correct bus frequency and core voltage. A clock generator and voltage regulator are provided to receive and interpret the ID bits and provide the correct frequency and voltage.

8 Claims, 4 Drawing Sheets

METHOD AND APPARATUS FOR AUTOMATIC FREQUENCY AND VOLTAGE SELECTION FOR MICROPROCESSORS

FIELD OF THE INVENTION

The present invention relates to data processing systems, and more particularly, to automatically selecting the frequency and voltage for microprocessors installed in computer systems.

BACKGROUND OF THE INVENTION

Technological advances in silicon technology are driving down the prices of microprocessors and support chips, thus allowing users to obtain computer components that operate faster, consume less power, and run more economically year to year. Computer and electronic product developers of personal computers have accommodated the need for upgradability, caused by constantly accelerating technological advances, by providing pluggable versions of the microprocessors. In some implementations, the pluggable microprocessors are placed in pin grid array (PGA) packages, that are easily removed and inserted into zero-insertion-force (ZIF) sockets. Most of the upgraded microprocessors run at the same bus speeds and use the same core voltages as the microprocessors they replaced. However, a breed of microprocessors have evolved which require different bus speeds and core voltages from the microprocessors they replaced.

One prior art technique uses jumpers/switches to allow one or two selectable frequencies or voltages for the upgraded microprocessors. However, the technique is cumbersome when there is a need to reconfigure the switches or jumpers to upgrade a microprocessor, due to the requirement to remove the covers of the computer system, identify and change the jumpers/switches for the new microprocessor. In addition, the limited number of switches/jumpers do not allow the optimum speed settings or core voltages for the upgraded microprocessor, thus prohibiting maximum performance.

Another prior art technique allows multiple models of central processing units to be plugged into the same socket using specialized circuitry capable of identifying the model of the central processing unit in the socket. The technique discloses how several models of the Intel Corporation's central processors (i.e., 80486SX, 80486DX and 80487SX) are manufactured using different pinouts capable of driving a signal to a "high" or "low" voltage when plugged into the socket. The identifying circuits detect the "high" or "low" state of the signal and drives a clock selector having two different bus clocks which then supplies the appropriate clock for the central processor. This technique allows a user to plug in an upgraded processor without the need to identify and adjust jumpers. However, the technique suffers from having a limited number of available clock settings and requires the available central processors be known when the board containing the socket is manufactured. In addition, the technique requires a complex pinout arrangement on the central processors to be determined before manufacture for enabling a "high" or "low" state when the processor is plugged into the socket. Finally, the technique provides no solution for changing multiple core voltages when the processors are plugged into the socket.

In yet another technique, a variable power supply is provided that is capable of supplying output voltages following a microprocessor upgrade. A microprocessor is provided with one or more identification (ID) pins. The ID pins are supplied to a power supply card containing a switch which is controlled by the ID pins. The power supply receives the ID pins and generates a voltage which is inputted into a regulator integrated circuit (IC) to be compared with a Vref value in the IC to control voltage to the microprocessor. The technique thus permits a processor requiring different voltages from the old processor to be plugged into a computer system without changing the power supply card. However, the technique suffers from having a limited number of available voltages. Prior knowledge of the required voltages is also necessary to enable the selection of the specialized ID pins on the microprocessor. In addition, users are required to know the switches and resistors values needed to adjust the level of the power supply voltage.

Consequently, it would be desirable to provide a technique for automatically providing frequency and voltage selection for a microprocessor plugged into a computer system.

SUMMARY OF THE INVENTION

This invention relates to a method and apparatus for providing automatic frequency and voltage selection for microprocessors in a computer system. Microprocessor identification (ID) bits are burned into a microprocessor during manufacture to specify the correct bus frequency and core voltage. A clock generator and voltage regulator receive and interpret the ID bits to provide the correct frequency and voltage. In the preferred embodiment, eight processor ID bits are provided for selecting a frequency and core voltage. The clock generator receives three processor ID bits and selects the frequency based on the ID signal. Likewise, the voltage regulator receives five voltage ID bits and generates a core voltage for the microprocessor.

DETAILED DESCRIPTION OF THE EMBODIMENTS

This invention provides a method and apparatus for specifying the correct bus frequency and core voltage for a microprocessor in a computer system. The technological advances in microprocessor development and design require that microprocessors in personal computers be upgradable. The upgraded microprocessors operate at levels below their design points when using a frequency or core voltage different from their optimum design points. This invention provides a solution to this problem in the form of microprocessor identification (ID) bits created on the microprocessor chip during its manufacturing process. The ID bits allow the microprocessor to specify the correct bus frequency and core voltage required for optimum operation. A clock generator and variable voltage regulator provide the necessary bus frequency and core voltage based on the microprocessor's ID bits. The invention will be explained in further detail using FIGS. 1–3.

Figure 1:
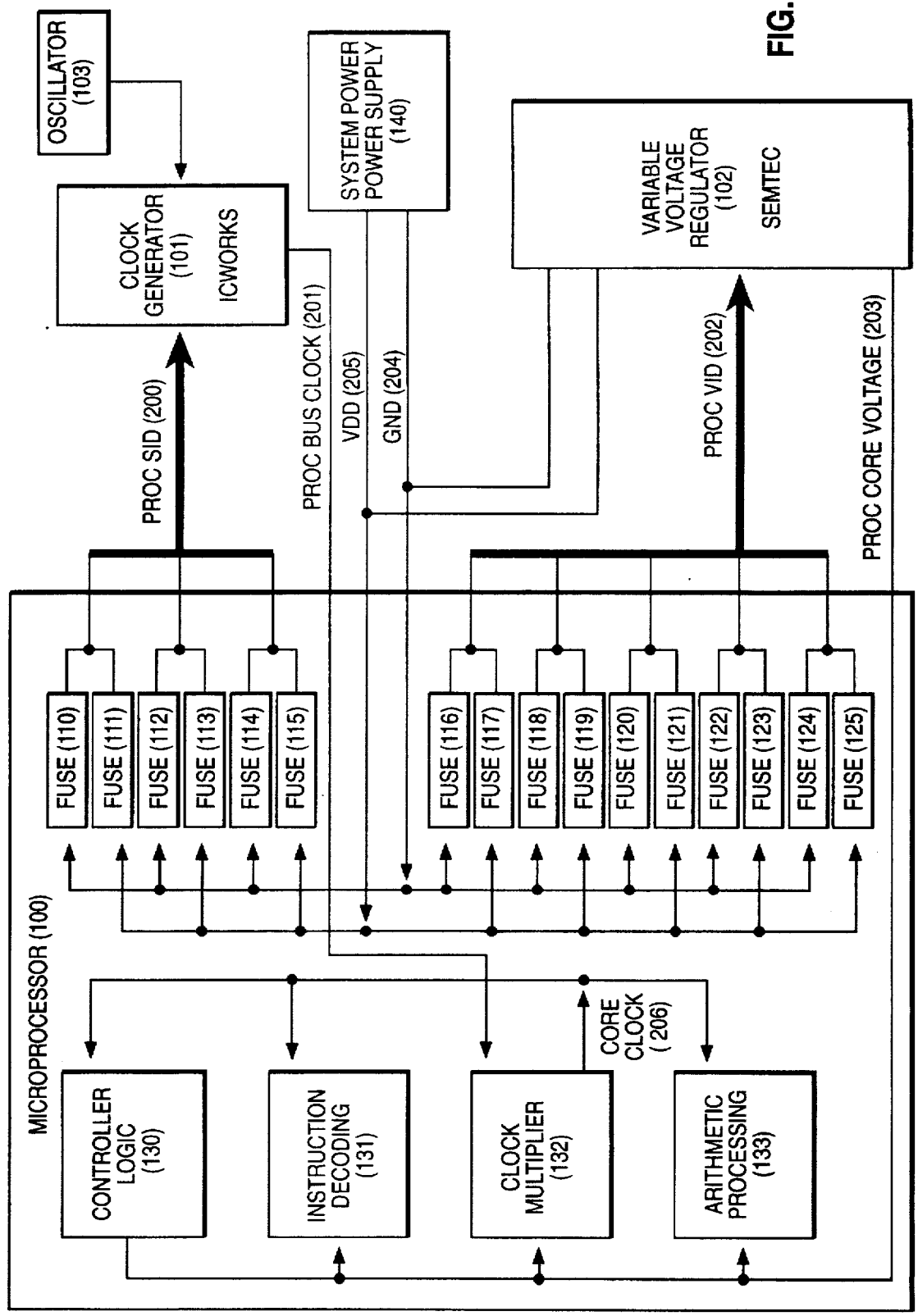
FIGS. 1 and 1A are illustrative embodiments of a microprocessor identification circuit of the present invention.

Referring now to FIG. 1, there is shown a pictorial representation of a computer system containing the microprocessor ID circuit of the invention. A microprocessor 100 contains control logic 130, instruction decoding logic 131, and arithmetic processing logic 133 which requires a particular core clock frequency 206 supplied by clock multiplier logic 132. In addition, the circuitry requires a core voltage 203 for optimum performance. In order to ensure the requisite frequency is received, microprocessor 100 provides processor speed identification (Proc SID) 200 signals to a clock generator 101. The clock generator 101 contains built-in circuitry to select a frequency based on the Proc SID signals 200. The clock generator 101 drives a Processor Bus Clock 201 signal back to the clock multiplier logic 132 on the microprocessor 100 based on the Proc SID 200 signals. An oscillator 103 is connected to clock generator 101 enabling the generation of the clock frequencies shown in TABLE A.

TABLE A

| Select Address | | | CPU | PCI |
|---|---|---|---|---|
| SEL2 | SEL1 | SEL0 | (MHZ) | (MHZ) |
| 0 | 0 | 0 | 50 | 33.3 |
| 0 | 0 | 1 | 60 | 33.3 |
| 0 | 1 | 0 | 66.6 | 33.3 |
| 0 | 1 | 1 | 55 | 33.3 |
| 1 | 0 | 0 | 50 | 25 |
| 1 | 0 | 1 | 60 | 30 |
| 1 | 1 | 0 | 66.6 | 33.3 |
| 1 | 1 | 1 | 55 | 27.5 |

Figure 2:
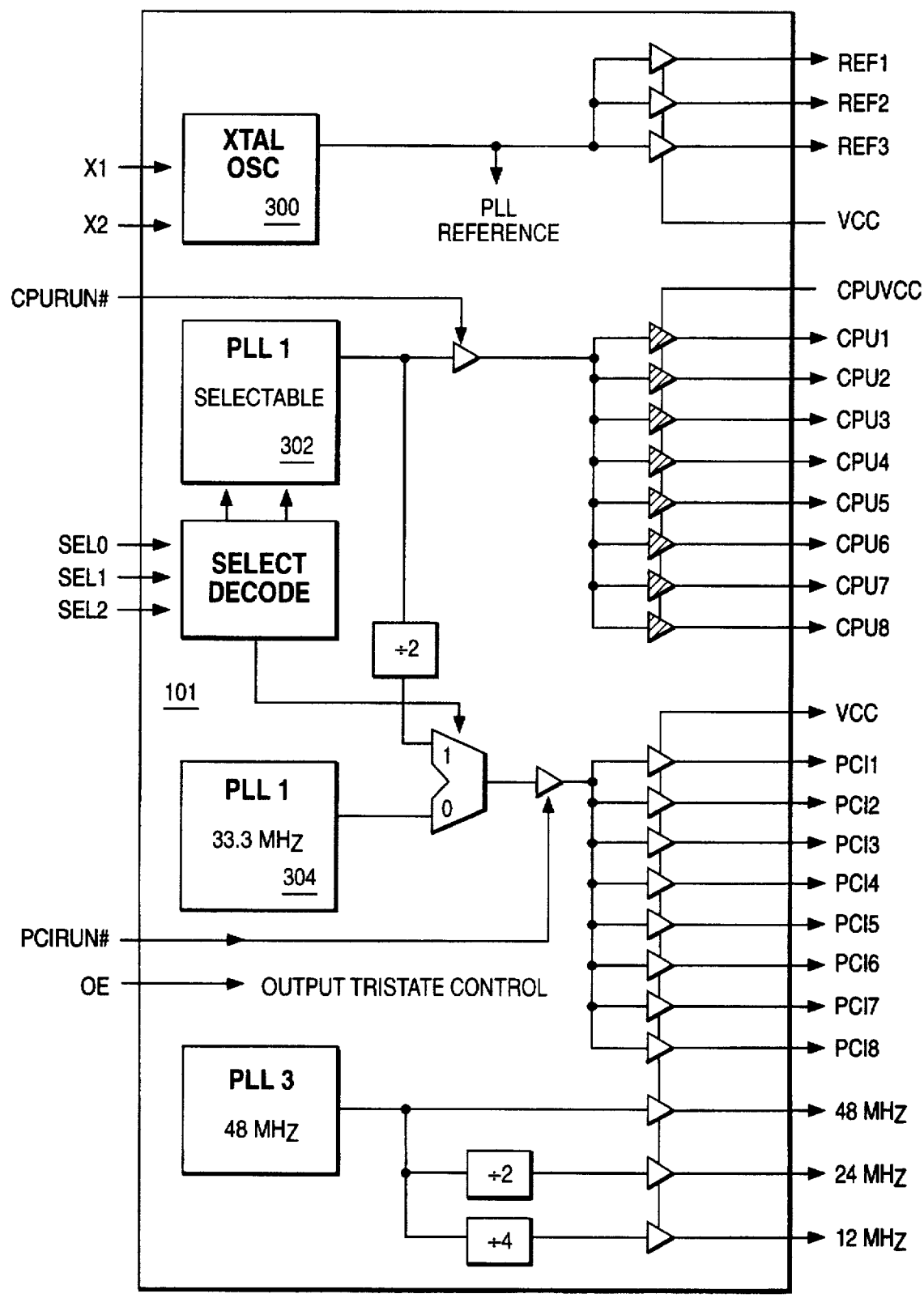
FIG. 2 is a pictorial of a clock generator module capable of providing multiple clock frequencies based on an inputted microprocessor value.

Referring now to FIG. 2, there is illustrated a more detailed pictorial of clock generator 101. The clock generator 101 contains a built-in crystal oscillator circuit 300 which generates a 14.318 MHZ reference clock (REF) when the oscillator 103 is connected. In addition, a phase lock loop 302 provides central processor unit (CPU) clocks (CPU1-4). A divide by two circuit 306 allows the central processor clocks (CPU1-4) to be provided as variable PCI bus clocks at one-half speed (PCI1:7). The available frequency selections for the clock generator 101 are shown in TABLE A. In the preferred embodiment, clock generator 101 is a CMOS part available from the IC WORKS Corporation as part number W49C65-03.

TABLE B

| VID4 | VID3 | VID2 | VID1 | VID0 | (VDC) |
|---|---|---|---|---|---|
| 0 | 0 | 1 | 0 | 1 | 1.800 |
| 0 | 0 | 1 | 0 | 0 | 1.850 |
| 0 | 0 | 0 | 1 | 1 | 1.900 |
| 0 | 0 | 0 | 1 | 0 | 1.950 |
| 0 | 0 | 0 | 0 | 1 | 2.000 |
| 0 | 0 | 0 | 0 | 0 | 2.050 |
| 1 | 1 | 1 | 1 | 1 | 2.000 |
| 1 | 1 | 1 | 1 | 0 | 2.100 |
| 1 | 1 | 1 | 0 | 1 | 2.200 |
| 1 | 1 | 1 | 0 | 0 | 2.300 |
| 1 | 1 | 0 | 1 | 1 | 2.400 |
| 1 | 1 | 0 | 1 | 0 | 2.500 |
| 1 | 1 | 0 | 0 | 1 | 2.600 |
| 1 | 1 | 0 | 0 | 0 | 2.700 |
| 1 | 0 | 1 | 1 | 1 | 2.800 |
| 1 | 0 | 1 | 1 | 0 | 2.900 |
| 1 | 0 | 1 | 0 | 1 | 3.000 |
| 1 | 0 | 1 | 0 | 0 | 3.100 |
| 1 | 0 | 0 | 1 | 1 | 3.200 |
| 1 | 0 | 0 | 1 | 0 | 3.300 |
| 1 | 0 | 0 | 0 | 1 | 3.400 |
| 1 | 0 | 0 | 0 | 0 | 3.500 |

Returning to FIG. 1, microprocessor 100 also provides processor voltage identification (Proc VID) signals 202 to a variable voltage regulator 102 to obtain an optimum core voltage. The variable voltage regulator 102 receives the Proc VID signals 202 and generates a processor core voltage 203 for microprocessor 100. In the preferred embodiment, five Proc VID signals 202 are provided that allow the selection of one of the core voltages shown in TABLE B.

Referring to FIG. 1, variable voltage regulator 102 is provided voltage 205 and Ground (Gnd) 204 by system power supply 140. The voltage regulator 102 accepts the voltage identification signals 202 and generates the desired core voltage 203 for microprocessor 100. In the preferred embodiment, variable voltage regulator 102 is a member of the MP60 series of modules available from SEMTECH Corporation. The voltages generated by variable voltage regulator 102 are shown in TABLE B.

Referring again to FIG. 1, a plurality of fuse connections 110–125 are shown on microprocessor 100. The presence or absence of the fuse allows a user to program a one or zero value for the ID signals to the clock generator 101 or variable voltage regulator 102. Each ID signal is constructed using a parallel path arrangement (i.e., Fuse 110 and Fuse 111 applies to the same signal) where one fuse is connected to a high value (i.e., Fuse 110 to VDD), and the other fuse to a low value (i.e., Fuse 111 to Gnd). Removal of the fuse connected to the high value (i.e. Fuse 110) allows the remaining fuse connected to the low value (i.e., Fuse 111) to force a low value (i.e., Gnd) on the ID signal. Conversely, removal of the fuse connected to the low value (i.e., Fuse 111) allows the remaining fuse connected to the high value (i.e., Fuse 110) to force a high value (i.e., VDD) on the ID signal. Therefore, the presence of the fuses provides a manufacture with the ability to easily customize the microprocessor 100 after it is packaged and screened for speed and voltage, so that a user can easily upgrade a computer system for optimum performance.

Figure 1A:
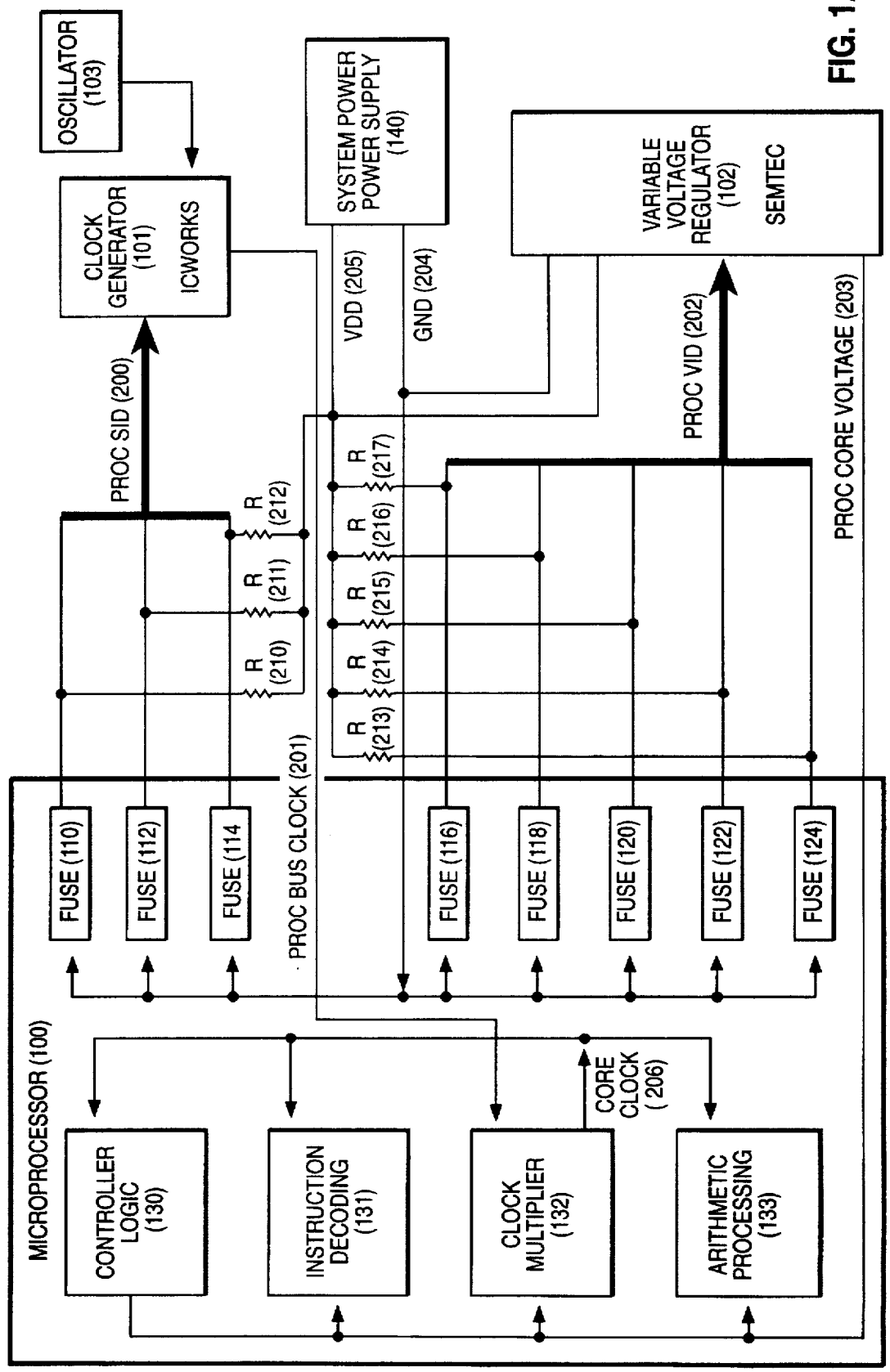

Referring now to FIG. 1A, an alternative embodiment of the invention is shown which reduces the number of microprocessor fuses. This embodiment uses fuses internal to the microprocessor 100 only when they are tied to ground. Weak pullup resistors to +3.3 volts are used external to the microprocessor 100 for all of the other signals.

Figure 3:
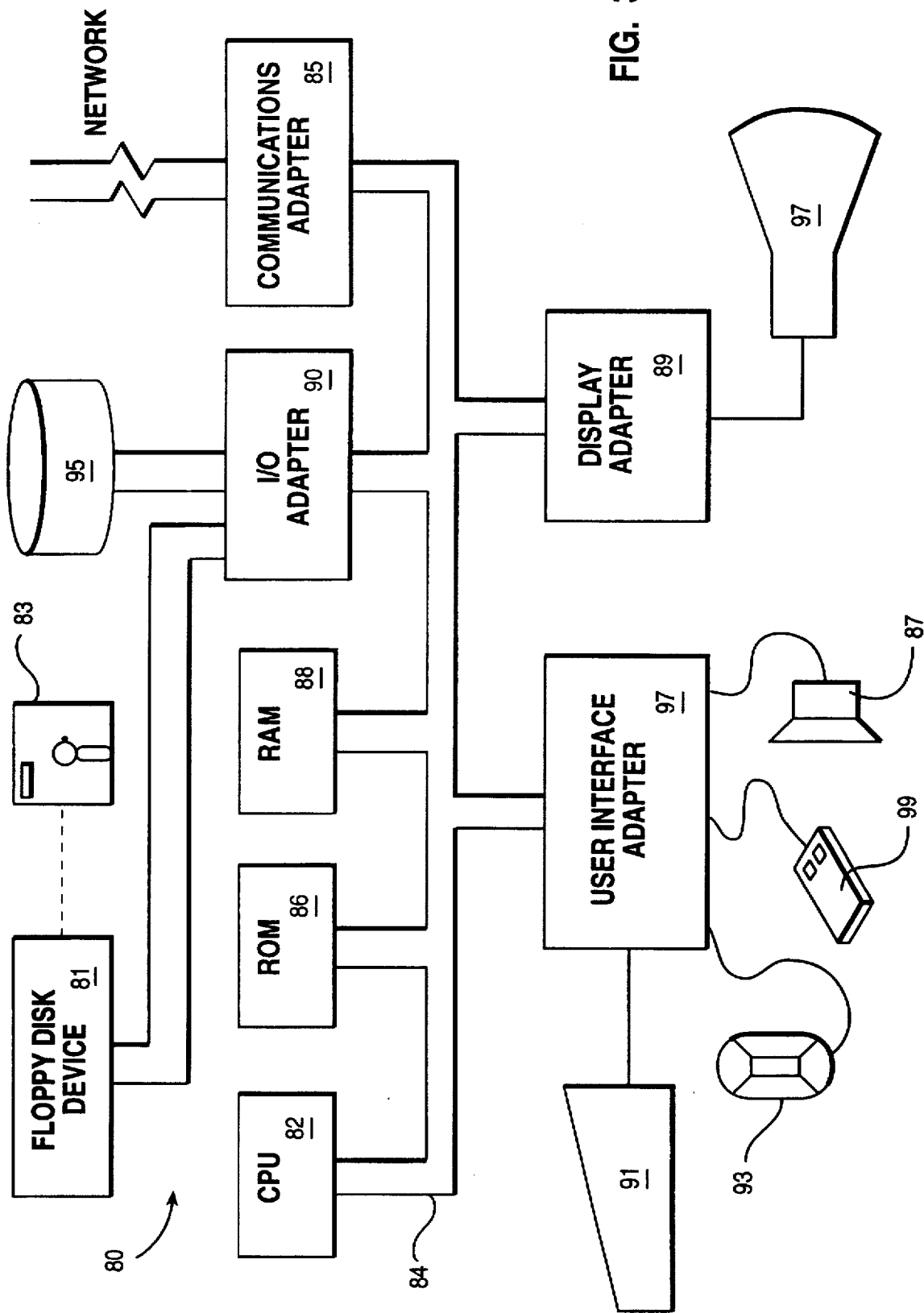
FIG. 3 is a pictorial of a workstation/computer system where the invention may be practiced.

Referring now to FIG. 3, there is shown a workstation/ computer system 80 where the invention may be practiced. The workstation 80, contains a CPU/microprocessor 82, such as a PowerPC 604 available from the IBM Corporation, which contains the microprocessor identification circuit of this invention. The CPU 82 is connected to random access memory (RAM) 88, read only memory (ROM) 86, through a bus 84. The CPU 82, is capable of communicating with a plurality of Input/Output (I/O) devices through I/O adapter 90. Hard disk storage 95, provides permanent storage of data/information for use by the CPU 82. A floppy disk device 81, provides removable storage for computer programs using floppy diskette 83. A display monitor 97, is provided to allow a user to observe the execution of data from the CPU 82. Data can also be inputted to the CPU 82, through keyboard 91, and microphone 93. Data displayed on monitor 97, can be manipulated using mouse 99. Output from programs operating on CPU 82, may be obtained over speaker 87. The workstation 80 may be connected to a network (not shown) through communications adapter 85.

While the invention has been described with respect to a preferred embodiment thereof, it will be understood by those skilled in the art that various changes in detail may be made therein without departing from the spirit, scope, and teaching of the invention. Accordingly, the herein disclosed invention is to be limited only as specified in the following claims.

What we claim is:

1. A method of identifying and specifying a frequency and core voltage for a microprocessor in a computer system, comprising the steps of:

providing on-chip programmable processor identification bits for said microprocessor on an integrated chip containing said microprocessor in said computer system;

detecting said on-chip programmable processor identification bits by a clock generator and generating a bus clock for said microprocessor in said computer system;

detecting said on-chip programmable processor identification bits by a variable voltage regulator and generating a core voltage for said microprocessor in said computer system; and transmitting said bus clock and core voltage to said microprocessor for operating said microprocessor on said integrated chip in said computer system.

2. The method of claim 1 wherein said step of providing on-chip programmable processor identification bits further comprises:

providing parallel fuse connections for each of said programmable processor identification bits on said microprocessor on said integrated chip; and burning one of said parallel fuse connections to establish a value for said processor identification bits on said microprocessor.

3. The method of claim 2 wherein the step of providing parallel fuse connections further comprises:

attaching said parallel fuse connections to a high value and low value.

4. The method of claim 3, wherein the high value is 3.3 volts and the low value is ground.

5. An apparatus for identifying and specifying a frequency and core voltage for a particular microprocessor, comprising:

means for providing on-chip processor identification bits for said particular microprocessor on an integrated chip containing said microprocessor in a programmable device on said particular microprocessor;

means for detecting said on-chip processor identification bits by a clock generator and generating a bus clock for said particular microprocessor;

means for detecting said on-chip processor identification bits by a voltage regulator and generating a core voltage for said particular microprocessor;

means for transmitting said bus clock and core voltage to said particular microprocessor on said integrated chip for operation in a computer system.

6. The apparatus of claim 5 wherein said means of providing on-chip programmable processor identification bits further comprises:

means for providing parallel fuse connections for each of said programmable processor identification bits on said microprocessor on said integrated chip; and means for removing one of said parallel fuse connections to establish a value for said processor identification bits on said microprocessor.

7. The apparatus of claim 6, wherein the means for providing parallel fuse connections further comprises:

means for attaching said parallel fuse connections to a high value and low value.

8. The apparatus of claim 7 wherein the high value is 3.3 volts and the low value is ground.

* * * * *